(12) United States Patent
Kim et al.

(10) Patent No.: US 10,593,842 B2
(45) Date of Patent: Mar. 17, 2020

(54) DISPLAY DEVICE WITH REDUCED WARPING AND METHOD FOR FABRICATING THE SAME

(71) Applicant: Samsung Display Co. Ltd., Yongin-si, Gyeonggi-do (KR)

(72) Inventors: Young Gu Kim, Yongin-si (KR); Taek Joon Lee, Yongin-si (KR); Hye Lim Jang, Hwaseong-si (KR); Baek Kyun Jeon, Yongin-si (KR); Jin Soo Jung, Hwaseong-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 15/803,260

(22) Filed: Nov. 3, 2017

(65) Prior Publication Data
US 2018/0130929 A1    May 10, 2018

(30) Foreign Application Priority Data
Nov. 9, 2016  (KR) .................. 10-2016-0148926

(51) Int. Cl.
| | | |
|---|---|---|
| H01L 33/50 | (2010.01) |
| G02F 1/1335 | (2006.01) |
| G02F 1/1333 | (2006.01) |
| G02F 1/017 | (2006.01) |
| H01L 21/02 | (2006.01) |

(52) U.S. Cl.
CPC ............ H01L 33/504 (2013.01); G02F 1/017 (2013.01); G02F 1/133345 (2013.01); G02F 1/133617 (2013.01); H01L 21/0203 (2013.01); H01L 33/507 (2013.01); *G02F 2001/01791* (2013.01); *G02F 2001/133548* (2013.01); *G02F 2202/36* (2013.01)

(58) Field of Classification Search
CPC ...................................................... H01L 33/504
See application file for complete search history.

(56) References Cited

U.S. PATENT DOCUMENTS

| | | | | |
|---|---|---|---|---|
| 6,413,879 B1* | 7/2002 | Maeda | ............. | H01L 21/02126 438/758 |
| 6,614,493 B1* | 9/2003 | Kim | .................. | G02F 1/136227 349/138 |
| 2003/0214041 A1* | 11/2003 | Suzuki | ................ | H01L 23/5283 257/758 |
| 2005/0046345 A1* | 3/2005 | Park | ..................... | H01L 51/5246 313/506 |
| 2007/0109474 A1* | 5/2007 | Yang | ................. | G02F 1/133514 349/114 |

(Continued)

FOREIGN PATENT DOCUMENTS

| | | |
|---|---|---|
| JP | 4695345 | 3/2011 |
| JP | 2011-076798 | 4/2011 |
| KR | 10-2012-0065748 | 6/2012 |

*Primary Examiner* — Lex H Malsawma
*Assistant Examiner* — Laura M Dykes
(74) *Attorney, Agent, or Firm* — Innovation Counsel LLP

(57) ABSTRACT

Provided are display device and method for fabricating the same. According to an aspect of the present disclosure, there is provided a display device comprising: a first substrate; at least one wavelength conversion layer disposed on the first substrate; a capping layer disposed on the wavelength conversion layer and comprising a porous layer; and a first polarizing layer disposed on the capping layer.

17 Claims, 12 Drawing Sheets

(56) References Cited

U.S. PATENT DOCUMENTS

| | | | |
|---|---|---|---|
| 2011/0317106 A1* | 12/2011 | Saito | G02F 1/133371 |
| | | | 349/106 |
| 2012/0153308 A1* | 6/2012 | Oh | H01L 51/5253 |
| | | | 257/88 |
| 2012/0235171 A1* | 9/2012 | Kim | H01L 51/5253 |
| | | | 257/88 |
| 2012/0241811 A1* | 9/2012 | Kim | H01L 51/5253 |
| | | | 257/100 |
| 2013/0335677 A1 | 12/2013 | You | |
| 2014/0290997 A1* | 10/2014 | Maeda | H01L 23/49822 |
| | | | 174/258 |
| 2015/0183932 A1* | 7/2015 | Katayama | C08J 5/18 |
| | | | 257/40 |
| 2015/0228232 A1* | 8/2015 | Lee | G09G 3/3607 |
| | | | 345/88 |
| 2017/0110686 A1* | 4/2017 | Kamiya | H01L 27/322 |

\* cited by examiner

DISPLAY DEVICE WITH REDUCED WARPING AND METHOD FOR FABRICATING THE SAME

This application claims priority from Korean Patent Application No. 10-2016-0148926 filed on Nov. 9, 2016 in the Korean Intellectual Property Office, the disclosure of which is incorporated herein by reference in its entirety.

BACKGROUND

1. Field of the Disclosure

The present disclosure relates to a display device and a method for fabricating the same.

2. Description of the Related Art

Display devices become more and more important as multimedia technology evolves. Accordingly, a variety of types of display devices such as liquid-crystal display (LCD) devices and organic light-emitting display (OLED) devices are currently used.

Among these, an LCD device is one of the most commonly used flat display devices. An LCD device includes two substrates on which field generating electrodes such as a pixel electrode and a common electrode are formed, and a liquid-crystal layer disposed therebetween. An LCD device displays an image in such a manner that voltage is applied to field generating electrodes to generate electric field across a liquid-crystal layer, and liquid-crystal molecules in the liquid-crystal layer are aligned by the electric field so as to control the polarization of incident light.

Each pixel of an LCD device may display one of primary colors for color reproduction. In order to allow each pixel to reproduce one of the primary colors, a color filter may be disposed for each pixel on the path of light from a light source to viewers. The color filter is disposed between the two polarizing plates so that it transmits only a portion of incident light in a particular wavelength band and absorbs the rest of the portions of the light in other wavelength bands, thereby reproducing primary colors.

One of the trends to develop liquid-crystal display devices is to improve the quality of the primary colors reproduced by the liquid-crystal display device. To achieve this, a variety of technical attempts are being currently made.

SUMMARY

Aspects of the present disclosure provide a display device capable of preventing a substrate from being warped due to stress exerted on the substrate.

Aspects of the present disclosure also provide a method of fabricating a display device capable of preventing a substrate from being warped due to stress exerted on the substrate.

These and other aspects, embodiments and advantages of the present disclosure will become immediately apparent to those of ordinary skill in the art upon review of the Detailed Description and Claims to follow.

According to an aspect of the present disclosure, there is provided a display device comprising: a first substrate; at least one wavelength conversion layer disposed on the first substrate; a capping layer disposed on the wavelength conversion layer and comprising a porous layer; and a first polarizing layer disposed on the capping layer.

The wavelength conversion layer may include quantum dots.

The thickness of the wavelength conversion layer may range from 5 μm to 7 μm.

The capping layer may further include a first inorganic layer disposed on the porous layer.

The porous layer and the first inorganic layer may be made of a same material.

The porous layer and the first inorganic layer may include at least one selected from a group consisting of silicon nitride, silicon oxide and silicon oxynitride.

The density of the porous layer may be smaller than that of the first inorganic layer.

The porous layer may have a thermal expansion coefficient larger than that of the first inorganic layer.

The porous layer may have a thermal expansion coefficient of 2.5 ppm/K to 5.0 ppm/K.

The capping layer may further include a second inorganic layer disposed on the first inorganic layer.

The first inorganic layer and the second inorganic layer may be made of different materials.

The capping layer may include a plurality of first inorganic layers and a plurality of second inorganic layers, and the first inorganic layers and the second inorganic layers may be alternately disposed.

The capping layer may be configured to transmit blue light and reflect green light and red light.

The at least one wavelength conversion layer may include a plurality of wavelength conversion layers, and the wavelength conversion layers may have different heights.

The display device may further include: a light-transmitting layer disposed adjacent to the wavelength conversion layer.

According to another aspect of the present disclosure, there is provided a method of fabricating a display device, the method comprising: preparing a first substrate having at least one wavelength conversion layer; forming a capping layer including a porous layer on the wavelength conversion layer; forming a planarization layer on the capping layer; and forming a first polarizing layer on the planarizing layer.

The forming the capping layer comprising a porous layer on the wavelength converting layer may include: forming the porous layer on the wavelength conversion layer, and forming a first inorganic layer on the porous layer.

The method may further include: forming a second inorganic layer on the first inorganic layer.

The first inorganic layer and the second inorganic layer may be made of different materials.

The process temperature for forming the porous layer may range from 50° C. to 150° C., and the process temperature for forming the first inorganic layer may be 200° C. or higher.

According to exemplary embodiments of the present disclosure, at least following effects can be achieved:

it is possible to prevent a substrate from being warped due to stress exerted on the substrate.

It should be noted that effects of the present disclosure are not limited to those described above and other effects of the present disclosure will be apparent to those skilled in the art from the following descriptions.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION OF THE EMBODIMENTS

Figure 1:
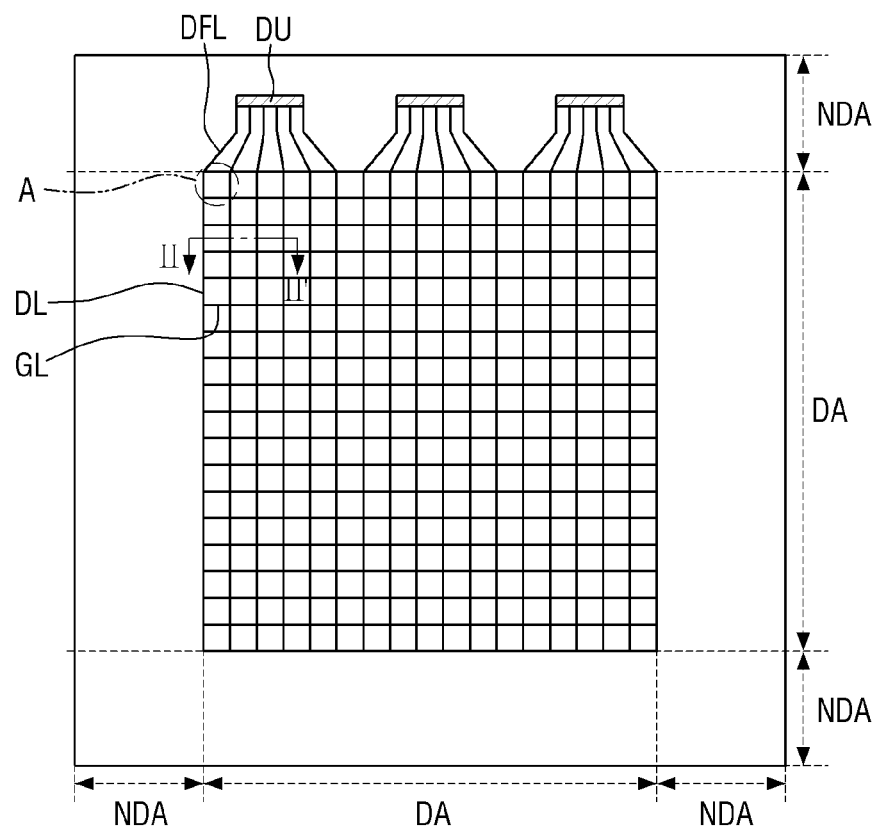
FIG. 1 is a layout diagram of a liquid-crystal display (LCD) device according to an exemplary embodiment of the present disclosure.

The aspects and features of the present inventice concept and methods for achieing the aspects and features will be apparent by referring to the embodiments to be described in detail with reference to the accompanying drawings. However, the present inventice concept is not limited to the embodiments disclosed hereinafter, but can be implemented in diverse forms. The matters defined in the description, such as the detailed construction and elements, are nothing but specific details provided to assist those of ordinary skill in the art in a comprehensive understanding of the invention, and the present inventice concept is only defined within the scope of the appended claims.

The term "on" that is used to designate that an element is on another element or located on a different layer or a layer includes both a case where an element is located directly on another element or a layer and a case where an element is located on another element via another layer or still another element. In the entire description of the present inventice concept, the same drawing reference numerals are used for the same elements across various figures.

Although the terms "first, second, and so forth" are used to describe diverse constituent elements, such constituent elements are not limited by the terms. The terms are used only to discriminate a constituent element from other constituent elements. Accordingly, in the following description, a first constituent element may be a second constituent element.

Hereinafter, preferred embodiments of the present inventice concept will be described in detail with reference to the attached drawings.

Figure 2:
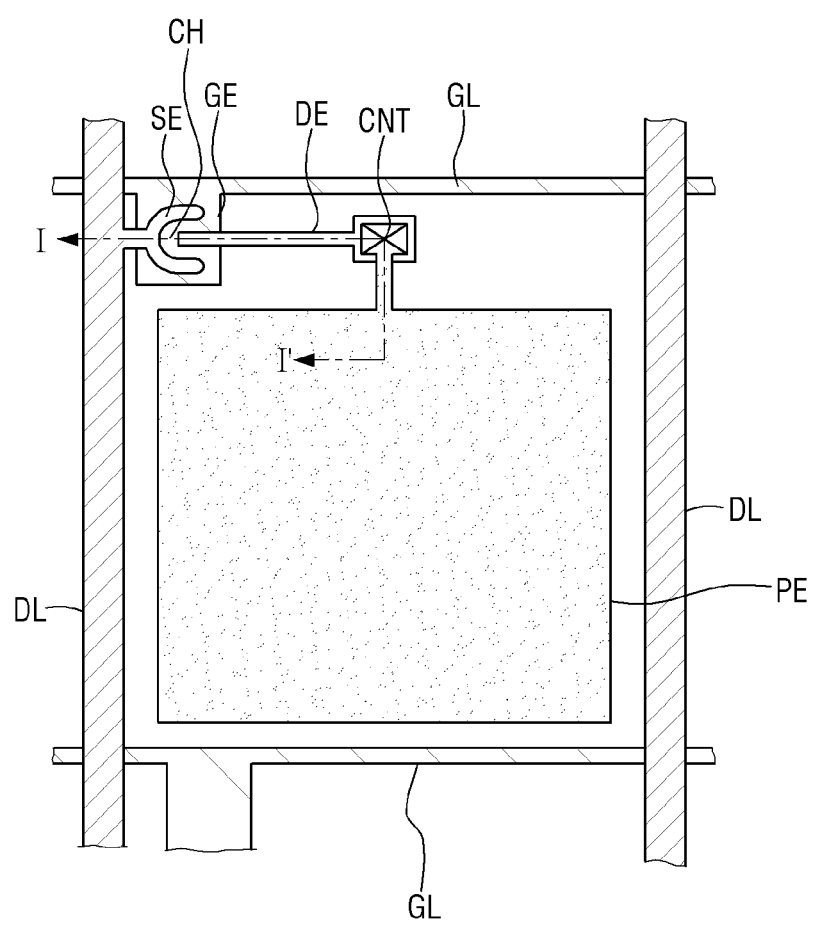
FIG. 2 is an enlarged view of portion A of FIG. 1.
Figure 3:
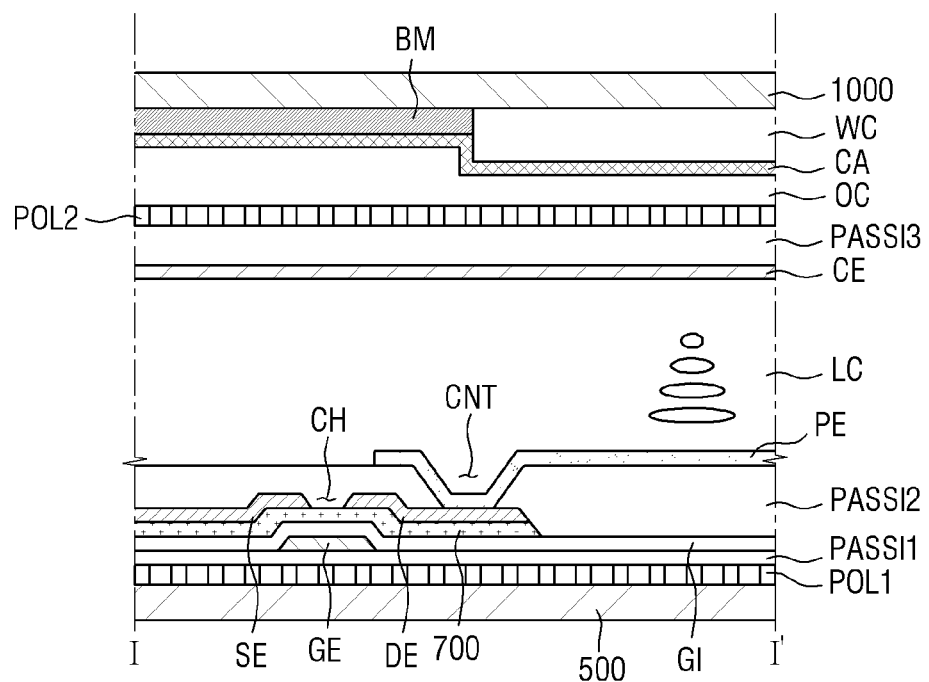
FIG. 3 is a cross-sectional view taken along line I-I' of FIG. 2.
Figure 4:
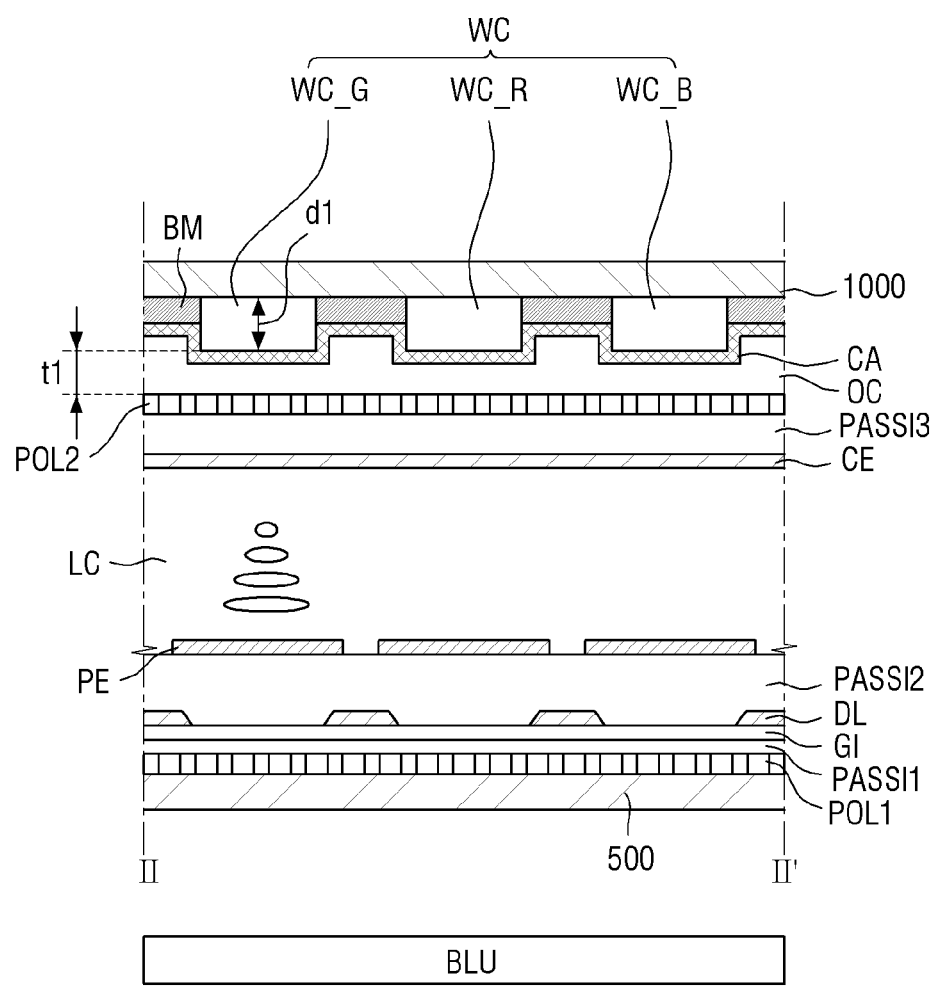
FIG. 4 is a cross-sectional view taken along line II-II of FIG. 1.
Figure 5:
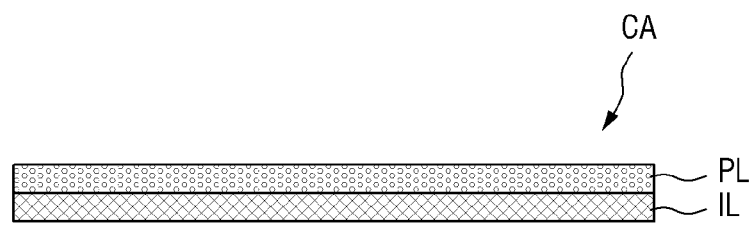
FIG. 5 is a cross-sectional view for illustrating some elements of FIG. 4.

FIG. 1 is a layout diagram of a liquid-crystal display (LCD) device according to an exemplary embodiment of the present disclosure. FIG. 2 is an enlarged view of portion A of FIG. 1. FIG. 3 is a cross-sectional view taken along line I-I' of FIG. 2. FIG. 4 is a cross-sectional view taken along line II-II' of FIG. 1. FIG. 5 is a cross-sectional view for illustrating some elements of FIG. 4.

Referring to FIGS. 1 to 5, a display device according to an exemplary embodiment of the present disclosure includes a first substrate 1000, at least one wavelength conversion layer WC disposed on the first substrate 1000, a capping layer CA disposed on the wavelength conversion layer WC and including a porous layer PL, and a first polarizing layer POL2 disposed on the capping layer CA.

The first substrate 1000 may be made of a material that is resistant to heat and is transparent. The first substrate 1000 may be made of, but is not limited to, a transparent glass or plastic. In an exemplary embodiment, the display device may include a second substrate 500 facing the first substrate 1000. For convenience of illustration, the second substrate 500 will be described first.

A display area DA and a non-display area NDA may be defined on the second substrate 500.

The display area DA refers to the area of the display device where an image is displayed. The non-display area NDA refers to the area of the display device where a variety of types of signal lines are disposed in order to display an image in the display area DA.

On the non-display area NDA, a plurality of data drivers DU for providing data signals to data lines DL, and a plurality of data fan-out lines DFL for transmitting signals provided from the data drivers DU to the data lines DL may be disposed.

On the display area DA, a plurality of pixels may be disposed, which are defined by the plurality of data lines DL and a plurality of gate lines GL intersecting one another. That is, FIG. 2 is an enlarged view of one of the plurality of pixels (portion A of FIG. 1). The display area DA may have substantially identical pixels.

Referring to FIG. 3, a second polarizing layer POL1 may be disposed on the second substrate 500. The second polarizing layer POL1 may polarize light provided from a backlight unit BLU to be described later. Specifically, the second polarization layer POL1 may transmit only a portion of the light provided from the backlight unit BLU that vibrates in a particular direction and absorb or reflect the other portion of the light.

In an exemplary embodiment, the second polarizing layer POL1 may be a polarizing film on which a polymer resin stretched in a particular direction and a light-absorbing material that absorbs light vibrating in a particular direction are adsorbed. In another exemplary embodiment, the second polarizing layer POL1 may be formed as a metal layer and may absorb or reflect some light and transmit some light. In yet another exemplary embodiment, the second polarizing layer POL1 may employ a wire grid polarizer (WGP). A detailed description thereof will be provided below.

A first passivation film PASSI1 may be disposed on the second polarizing layer POLE The first passivation film PASSI1 may include an inorganic insulating material. For example, the first passivation film PASSI1 may be made of silicon oxide, silicon nitride, silicon oxynitride, aluminum oxynitride, titanium oxynitride, zirconium oxynitride, hafnium oxynitride, tantalum oxynitride, tungsten oxynitride or the like. It is to be understood that the above-listed materials are merely illustrative, and the material of the first passivation film PASSI1 is not limited thereto.

Gate wire GL and GE may be disposed on the first passivation film PASSI1. The gate wiring GL and GE may include a gate line GL that receives a signal necessary for driving, and a gate electrode GE protruding from the gate line GL. The gate line GL may be extended in a first direction. The first direction may be substantially identical to the x-axis direction of FIG. 2. The gate electrode GE is one of three terminals of a thin-film transistor. The other two terminals, i.e., a source electrode SE and a drain electrode DE, will be described below.

The gate wiring GL and GE may include at least one of: an aluminum-based metal including an aluminum alloy; a silver (Ag)-based metal including a silver alloy; a copper (Cu)-based metal including a copper alloy; a molybdenum (Mo)-based metal including a molybdenum alloy; chrome (Cr); titanium (Ti); and tantalum (Ta). The material of the gate wiring GL and GE is not limited to those listed above. Other metals or polymer materials may be used as the material of the gate wiring GL and GE to meet the requirement of a desired display device.

The gate wiring GL and GE may be made up of a single layer, for example. It is to be understood that the gate wiring GL and GE may be made up of a double-layer, a triple-layer or multi-layer.

A gate insulating layer GI may be disposed on the gate wiring GL and GE. The gate insulating layer GI may cover the gate wiring GL and GE and may be formed throughout the entire surface of the second substrate 500.

The gate insulating layer GI may be formed by mixing one or more materials selected from the group consisting of: an inorganic insulating material such as silicon oxide (SiOx) and silicon nitride (SiNx); and an organic insulating material such as benzocyclobutene (BCB), an acryl-based material and polyimide. It is to be understood that the material of the gate insulating layer GI is not limited to those listed above.

A semiconductor pattern layer 700 may be disposed on the gate insulating layer GI.

The semiconductor pattern layer 700 may include amorphous silicon or polycrystalline silicon. It is to be understood that the material of the semiconductor pattern layer 700 is not limited thereto but may include oxide semiconductor.

The semiconductor pattern layer 700 may have a variety of shapes such as an island or a line. If the semiconductor pattern layer 700 has a line shape, the semiconductor pattern layer 700 may be disposed under the data line DL to be extended to the top of the gate electrode GE.

In an exemplary embodiment, the semiconductor pattern layer 700 may be patterned in substantially the same shape as the data lines DL, SE and DE in the entire region except a channel CH, which will be described below.

In other words, the semiconductor pattern layer 700 may be disposed such that, except the channel CH, it overlaps with the data lines DL, SE and DE.

The channel CH may be formed between the source electrode SE and the drain electrode DE facing each other. The channel CH electrically connects the source electrode SE to the drain electrode DE, the shape of which is not particularly limited herein.

An ohmic contact layer (not shown) may be disposed on the semiconductor pattern layer 700, which is highly doped with an n-type impurity. The ohmic contact layer may overlap with the semiconductor pattern layer 700 partially or completely. It is to be noted that the ohmic contact layer may be eliminated in an exemplary embodiment where the semiconductor pattern layer 700 includes an oxide semiconductor.

When the semiconductor pattern layer 700 is an oxide semiconductor, the semiconductor pattern layer 700 may include zinc oxide (ZnO). In addition, one or more ions selected from the group consisting of gallium (Ga), indium (In), stannum (Sn), zirconium (Zr), hafnium (HD, cadmium (Cd), silver (Ag), copper (Cu), germanium (Ge), gadolinium (Gd), titanium (Ti), and vanadium (V) may be doped onto the semiconductor pattern layer 700. For example, the semiconductor pattern layer 700, which is an oxide semiconductor, may include one or more selected from the group consisting of: ZnO, ZnGaO, ZnInO, ZnSnO, GaInZnO, CdO, InO, GaO, SnO, AgO, CuO, GeO, GdO, HfO, TiZnO, InGaZnO and InTiZnO. It is to be understood that the above-listed compounds are merely illustrative and are not limiting.

The data wiring DL, SE and DE may be disposed on the semiconductor pattern layer 700. The data wiring DL, SE and DE may include a data line DL, a source electrode SE and a drain electrode DE.

The data lines DL may be extended in a second direction, e.g., in the y-axis direction of FIG. 2 to intersect the gate lines GL. The source electrode SE may branch off from the data lines DL and may be extended to the top of the semiconductor pattern layer 700.

The drain electrode DE may be spaced apart from the source electrode SE and may be disposed to face the source electrode SE above the semiconductor pattern layer 700 with the gate electrode GE or the channel CH therebetween. The drain electrode DE may be in contact with and electrically connected to a pixel electrode PE to be described later.

The data wiring DL, SE and DE may be made up of a single layer or multiple layers made of nickel (Ni), cobalt (Co), titan (Ti), silver (Ag), copper (Cu), molybdenum (Mo), aluminum (Al), beryllium (Be), niobium (Nb), gold (Au), iron (Fe), selenium (Se), tantalum (Ta), or the like. In addition, the material of the data wiring DL, SE and DE may include an alloy formed by adding at least one element selected from the group consisting of titanium (Ti), zirconium (Zr), tungsten (W), tantalum (Ta), niobium (Nb), platinum (Pt), hafnium (HD, oxygen (O) and nitrogen (N) to the metal. It is to be understood that the material of the data wiring DL, SE and DE is not limited to those listed above.

Although FIG. 2 shows a single pixel having a thin-film transistor, those skilled in the art would understand that the present disclosure is not limited thereto. In other exemplary embodiments, a single pixel may include more than one thin-film transistors. When a plurality of thin-film transistors is disposed in a single pixel, the pixel may be divided into a plurality of domains, each corresponding to the respective thin-film transistors.

A passivation layer PA may be disposed on the data wiring DL, SE and DE, and the gate wiring GL and GE. A second passivation layer PASSI2 may be disposed on the data wiring DL, SE and DE and the semiconductor pattern layer 700. The second passivation layer PASSI2 may be made of an inorganic insulating material or an organic insulating material.

The second passivation layer PASSI2 may include a contact hole CNT via which at least a part of the drain electrode DE is exposed.

The pixel electrode PE may be disposed on the second passivation layer PASSI2. The pixel electrode PE may be electrically connected to the drain electrode DE via the contact hole CNT.

In an exemplary embodiment, the pixel electrode PE may be made of a transparent conductor such as indium tin oxide (ITO) and indium zinc oxide (IZO), or a reflective conductor such as aluminum.

Although FIG. 2 shows the plate-like pixel electrode PE, the shape of the pixel electrode is not limited thereto. In another exemplary embodiment, the pixel electrode may have a structure including at least one slit, for example. In yet another exemplary embodiment, more than one pixel electrodes may be disposed, where different voltages may be applied to different pixel electrodes.

Referring to FIG. 4, a backlight unit BLU may be disposed below the second substrate 500. The backlight unit BLU may provide light for driving the display device. The backlight unit BLU may be either an edge-type backlight unit in which light sources are disposed on the sides or a direct-type backlight unit in which light sources are disposed on the upper surface.

In addition, in an exemplary embodiment, the light sources employed by the backlight unit BLU may emit light in the ultraviolet wavelength band.

In an exemplary embodiment in which the wavelength conversion layer WC includes quantum dots, the backlight unit BLU may emit light in the blue wavelength band.

As described above, the first substrate 1000 may be disposed such that it faces the second substrate 500.

Referring to FIGS. 3 and 4, a black matrix BM and a plurality of wavelength conversion layers WC may be disposed on the first substrate 1000.

The black matrix BM may be extended in the first direction to overlap with the gate line GL or may be extended in the second direction to overlap with the data line DL.

Further, the black matrix BM may overlap with the thin-film transistor.

The black matrix BM may block light coming from the outside or may prevent light from scattering in the device. To this end, the black matrix BM may be made of a photosensitive resin containing a black pigment. It is to be understood that this is merely illustrative. Any material may be used for the material of the black matrix as long as it has physical properties necessary for blocking external light.

The wavelength conversion layers WC may be disposed at portions not covered with the black matrix BM, that is, portions exposed by the black matrix BM. The wavelength conversion layers WC may convert the wavelength of light that has passed through a liquid-crystal layer LC to be described below and the first polarizing layer POL2. In other words, the wavelength conversion layers WC may convert the wavelength of light passing through the liquid-crystal layer LC and the first polarizing layer POL2 so that light passing through the wavelength conversion layers WC has a specific color.

This will be described in detail with reference to FIG. 4. In an exemplary embodiment, the wavelength conversion layers WC may include a green wavelength conversion layer WC_G for imparting green color to light passing through it, a red wavelength conversion layer WC_R for imparting red color to light passing through it, and a blue wavelength conversion layer WC_B for imparting blue color to light passing through it.

In an exemplary embodiment, the wavelength conversion layers WC may include green, red, and blue color filters.

The plurality of wavelength conversion layers WC may be arranged in a first direction or a second direction perpendicular to the first direction. In other words, the wavelength conversion layers may be arranged in a matrix having a plurality of columns and rows. In an exemplary embodiment in which a plurality of pixels is arranged in a matrix having rows and columns, each of the wavelength conversion layers WC may be disposed in the respective pixels. In other words, at least one of the green, red, and blue wavelength conversion layers may be disposed in each of the pixels.

In an exemplary embodiment, the green wavelength conversion layers WC_G, the red wavelength conversion layers WC_R and the blue wavelength conversion layers WC_B may be disposed adjacent to one another.

The green wavelength conversion layers WC_G and the red wavelength conversion layers WC_R may be spaced apart from each other by a predetermined distance. That is, there may be a spacing between the green wavelength conversion layers WC_G and the red wavelength conversion layers WC_R. Similarly, the red wavelength conversion layers WC_R and the blue wavelength conversion layers WC_B may be spaced apart from each other. That is, there may also be a spacing between the red wavelength conversion layers WC_R and the blue wavelength conversion layers WC_B.

In an exemplary embodiment, the wavelength conversion layers WC may include quantum dots. The quantum dots included in the wavelength conversion layers WC may be II-VI quantum dots including CdSe/ZnS, CdSe/CdS/ZnS, ZnSe/ZnS or ZnTe/ZnSe. In another exemplary embodiment, the quantum dots may be III-V quantum dots including InP/ZnS, or quantum dots including CuInS (2)/ZnS.

When the wavelength conversion layers WC include quantum dots, the wavelength of light having passed through the wavelength conversion layers WC may vary depending on the size of the quantum dots. For example, depending on the size of the quantum dots, each wavelength conversion layers WC may emit one of green light, red light and blue light.

When the wavelength conversion layers WC includes quantum dots, the thickness d1 of the wavelength conversion layers WC may range from 5 μm to 7 μm. When the wavelength conversion layers WC include quantum dots, level differences may become larger due to the thickness of the wavelength conversion layers WC.

The black matrix BM may be disposed between the green wavelength conversion layers WC_G and the red wavelength conversion layers WC_B. In other words, the black matrix BM may be disposed in the spacing between the green wavelength conversion layers WC_G and the red wavelength conversion layers WC_R. Similarly, the black matrix BM may also be disposed between the red wavelength conversion layers WC_R and the blue wavelength conversion layers WC_B.

That is, the black matrix BM may be disposed between every two wavelength conversion layers WC.

The capping layer CA may be formed on the plurality of wavelength conversion layers WC and the black matrix BM. That is, the capping layer CA may be formed on the entire surface of the first substrate 1000, covering the black matrix BM and the wavelength conversion layers WC.

Hereinafter, the capping layer CA will be described in detail with reference to FIG. 5.

In an exemplary embodiment, the capping layer CA may include a porous layer PL and at least one inorganic layer IL.

As used herein, the porous layer may be defined as a layer including a plurality of micropores. That is, the porous layer may have a relatively low density as compared with other layers made of the same material.

When the capping layer CA includes the porous layer PL, the thermal expansion coefficient of the capping layer CA may be relatively large as compared with the capping layer CA without the porous layer PL.

As will be described later, a planarization layer OC may be disposed on the capping layer CA. When the difference in the thermal expansion coefficient between the capping layer CA and the planarization layer OC increases, a panel warpage may otherwise occur, i.e., the display device may otherwise be warped. When the capping layer CA includes the porous layer PL as described above, the thermal expansion coefficient of the capping layer CA increases, such that the difference in thermal expansion coefficient therebetween is reduced. As a result, it is possible to prevent the panel warpage.

In an exemplary embodiment, the porous layer PL may have a thermal expansion coefficient of 2.5 ppm/K to 5.0 ppm/K. The thermal expansion coefficient of the inorganic layer IL may be 2.1 ppm/K or less.

In an exemplary embodiment, the porous layer PL and the inorganic layer IL may be made of the same material. For example, the porous layer PL and the inorganic layer IL may include at least one selected from the group consisting of silicon nitride (SiNx), silicon oxide (SiOx) and silicon oxynitride (SIONx). Even in this case, the density of the porous layer PL may be lower than the density of the inorganic layer IL.

In another exemplary embodiment, the porous layer PL and the inorganic layer IL may be made of different materials. For example, the porous layer PL may be made of silicon nitride (SiNx), and the inorganic layer IL may be made of at least one selected from silicon oxide (SiOx) and silicon oxynitride (SIONx).

In an exemplary embodiment, the porous layer PL may come in contact with the planarization layer OC, and the inorganic layer IL may come in contact with wavelength conversion layers WC.

In an exemplary embodiment, the capping layer CA may be a yellow recycling filter (YRF). That is, the capping layer CA may be an optical filter that reflects green light and red light and transmits blue light.

The planarization layer OC may be disposed on the capping layer CA. The planarization layer OC may be made of an organic and/or inorganic insulating material. The planarization layer OC may be formed over the entire area of the first substrate 1000 and provide a flat surface over the features formed on the first substrate 1000. Although FIG. 4 illustrates the planarization layer OC made up of a single layer, this is merely illustrative. In another embodiment, the planarization layer OC may include two or more layers.

In an exemplary embodiment, the thickness of the planarization layer OC may be defined as the distance t1 (see FIG. 4) from the upper surface of the wavelength conversion layers WC to the upper surface of the planarization layer OC.

In an exemplary embodiment, the thickness of the planarization layer OC may range from 6 μm to 10 μm. However, in another embodiment, the thickness of the planarization layer OC may be more than 10 μm.

In an exemplary embodiment, the thermal expansion coefficient of the planarization layer OC may be 53.3 ppm/K or less.

If the difference in the thermal expansion coefficient between the planarization layer OC and the capping layer CA is large, the substrate may be warped during the process. That is, tensile stress acts on the planarization layer OC due to the difference in the thermal expansion coefficient, and the substrate may be warped accordingly.

When the capping layer CA includes the porous layer PL as described above, the thermal expansion coefficient of the capping layer CA increases such that the difference in the thermal expansion coefficient between the capping layer CA and the planarization layer OC can be reduced, and thus it is possible to prevent the substrate from being warped.

In an exemplary embodiment, the planarization layer OC may include polyimide PI, but this is merely illustrative. It is to be understood that the material of the planarization layer OC is not limited thereto.

The first polarizing layer POL2 may be disposed on the planarization layer OC. The first polarizing layer POL2 may polarize light that has been provided from the backlight unit BLU and passed through the liquid-crystal layer LC. Specifically, the first polarizing layer POL2 may transmit only a portion of the light having passed through the liquid-crystal layer LC that vibrates in a specific direction and may reflect the other portion of the light.

The direction in which the light transmitted by the first polarizing layer POL2 vibrates may be the same as or different from the direction in which light transmitted by the second polarizing layer POL1 vibrates. For example, in an exemplary embodiment in which the second polarizing layer POL1 transmits light vibrating in a first direction, the first polarizing layer POL2 may transmit light vibrating in the first direction or may transmit the light vibrating in a second direction different from the first direction (e.g., a direction perpendicular to the first direction).

In an exemplary embodiment, the first polarizing layer POL2 may include a wire-grid-polarizer (WGP) that linearly polarizes the incident light.

Accordingly, the first polarizing layer POL2 may include a fine metal wire pattern arranged parallel to one another in one direction. Such a fine metal wire pattern may have a line width of approximately 60 nm or less and a thickness of approximately 150 nm or less. It is to be noted that the line width and thickness are merely illustrative and may vary depending on design choice. Among lights incident on the first polarizing layer POL2, only the light in parallel with the fine metal wire pattern can pass through the first polarizing layer POL2, so that the light can be polarized by the first polarizing layer POL2.

The first polarizing layer POL2 may be made of a metal having high reflectivity. For example, the first polarizing layer POL2 may include at least one selected from the group consisting of aluminum, gold, silver, copper, chromium, iron, nickel and molybdenum. However, this is merely illustrative and the material of the first polarizing layer POL2 is not limited thereto.

Although FIG. 4 illustrates the first polarizing layer POL2 made up of a single layer, the first polarizing layer POL2 may have a multi-layer structure of two or more layers in other exemplary embodiments.

A third passivation layer PASSI3 may be disposed on the first polarizing layer POL2.

A common electrode CE may be disposed on the third passivation layer PASSI3. The common electrode CE may be an unpatterned, single sheet electrode. A common voltage may be applied to the common electrode CE. When the voltage applied to the common electrode CE is different from the voltage applied to the pixel electrode PE, there may be formed an electric field between the common electrode CE and the pixel electrode PE.

The liquid-crystal layer LC in which liquid crystal molecules are disposed may be interposed between the first substrate 1000 and the second substrate 500. The liquid-crystal layer LC may be controlled by the electric field formed between the common electrode CE and the pixel electrode PE. By controlling the orientation of the liquid crystal molecules in the liquid-crystal layer LC, it is possible to control the light necessary for displaying images.

Hereinafter, a display device according to another exemplary embodiment of the present disclosure will be described. In the following description, the same or similar elements will be denoted by the same or similar reference numerals, and redundant descriptions will be omitted or briefly described.

Figure 6:
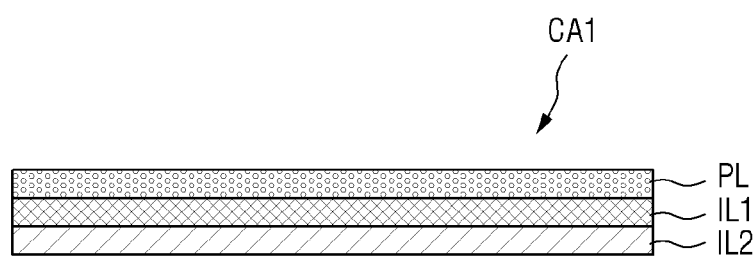
FIG. 6 is a cross-sectional view of some elements of a display device according to another exemplary embodiment of the present disclosure.

FIG. 6 is a cross-sectional view of some elements of a display device according to another exemplary embodiment of the present disclosure.

Referring to FIG. 6, the display device according to this exemplary embodiment of the present disclosure is different from the display device according to the exemplary embodiment shown in FIG. 5 in that a cap layer CA1 includes a porous layer PL1, a first inorganic layer ILL and a second inorganic layer IL2.

Since the porous layer PL1 is substantially identical to that described above with reference to FIG. 5; and, therefore, the redundant description will be omitted.

The capping layer CA may comprise two or more layers of different kinds of inorganic layers.

In an exemplary embodiment, the first inorganic layer IL1 may be silicon nitride (SiNx), and the second inorganic layer IL2 may be silicon oxide (SiOx).

In another exemplary embodiment, the first inorganic layer IL1 may be silicon oxide (SiOx), and the second inorganic layer IL2 may be silicon nitride (SiNx).

In other words, the first inorganic layer IL1 may be made of one selected from silicon nitride (SiNx), silicon oxide (SiOx) and silicon oxynitride (SIONx), and the second inorganic layer IL2 may be made of another one selected from silicon nitride (SiNx), silicon oxide (SiOx) and silicon oxynitride (SIONx).

In an exemplary embodiment, the porous layer PL may come in contact with the planarizing film OC, and the inorganic layer made of one of silicon nitride (SiNx), silicon oxide (SiOx) and silicon oxynitride (SIONx) may come in contact with the wavelength conversion layers WC.

Figure 7:
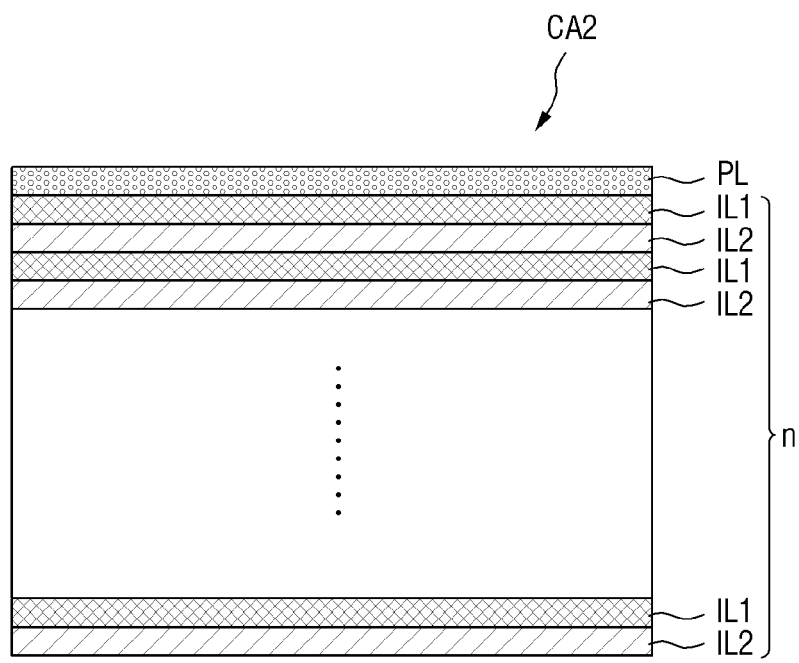
FIG. 7 is a cross-sectional view of some elements of a display device according to another exemplary embodiment of the present disclosure.

FIG. 7 is a cross-sectional view of some elements of a display device according to another exemplary embodiment of the present disclosure.

Referring to FIG. 7, the display device according to this exemplary embodiment of the present disclosure may include a porous layer PL, a plurality of first inorganic layers ILL and a plurality of second inorganic layers IL2.

The materials of the porous layer PL, the first inorganic layers IL1 and the second inorganic layers IL2 are substantially identical to those described above with reference to FIG. 6; and, therefore, the redundant description will be omitted.

In an exemplary embodiment, the first inorganic layers IL1 and the second inorganic layers IL2 may be arranged alternately. In this case, the first inorganic layers IL1 and the second inorganic layers IL2 may be repeatedly arranged at least once.

One first inorganic layer IL1 and one second inorganic layer IL2 may form a single layer.

In an exemplary embodiment, the capping layer CA2 may comprise n layers. In an exemplary embodiment, n may be a number between ten and twenty.

Figure 8:
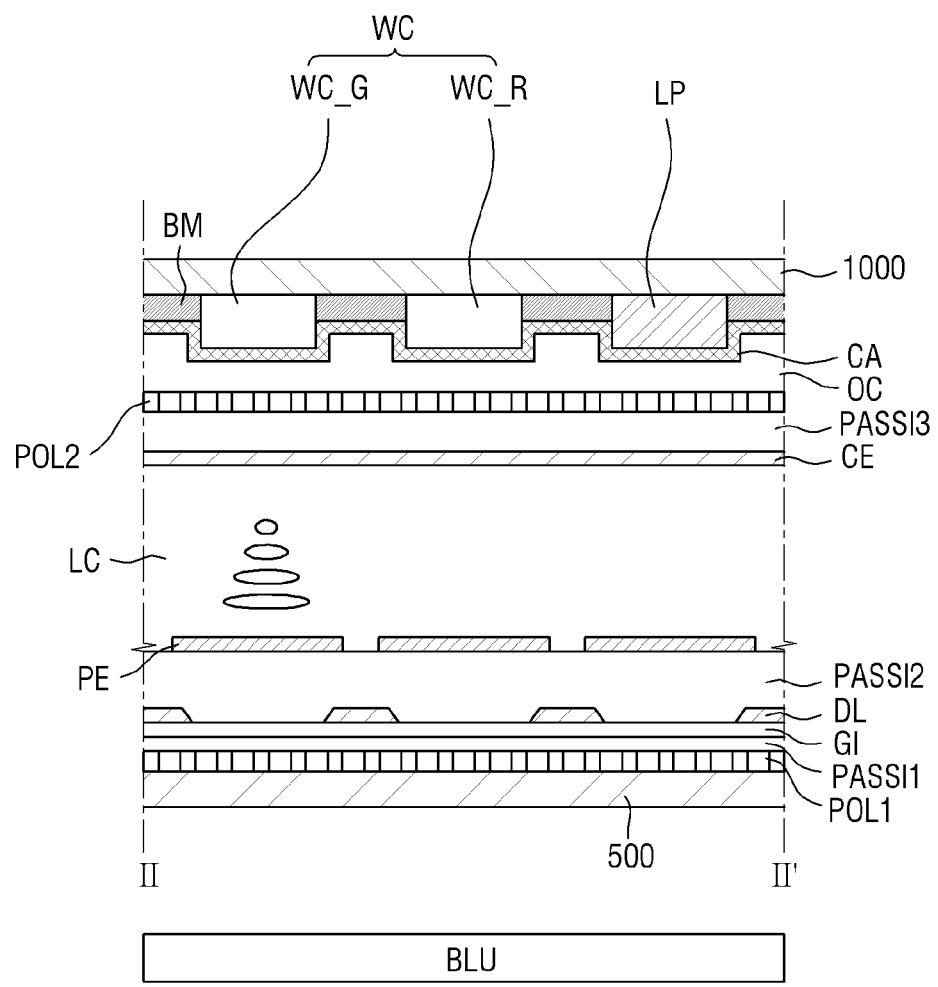
FIG. 8 is a cross-sectional view of a display device according to another exemplary embodiment of the present disclosure.

FIG. 8 is a cross-sectional view of a display device according to another exemplary embodiment of the present disclosure/

Referring to FIG. 8, the display device according to this exemplary embodiment of the present disclosure is different from the display device according to the embodiment shown in FIG. 4 in that the former includes a light-transmitting layer LP.

In an exemplary embodiment in which the backlight unit BLU includes blue light, the blue wavelength conversion layers WC_B may be replaced with the light-transmitting layer LP. The light-transmitting layer LP is made of a transparent material and may transmit the light of the blue wavelength band provided from the backlight unit BLU as it is. In other words, the wavelength of light reaching the light-transmitting layer LP may be substantially identical to the wavelength of light passing through the light-transmitting layer LP. In other words, the light-transmitting layer LP does not change the wavelength of transmitted light. Even though the light-transmitting layer LP transmits light without changing the wavelength, the blue color can be reproduced because the light provided from the backlight unit BLU has the blue wavelength band.

The light-transmitting layer LP may be made of a transparent metal material. The light-transmitting layer LP may comprise, for example, $TiO_2$.

Figure 9:
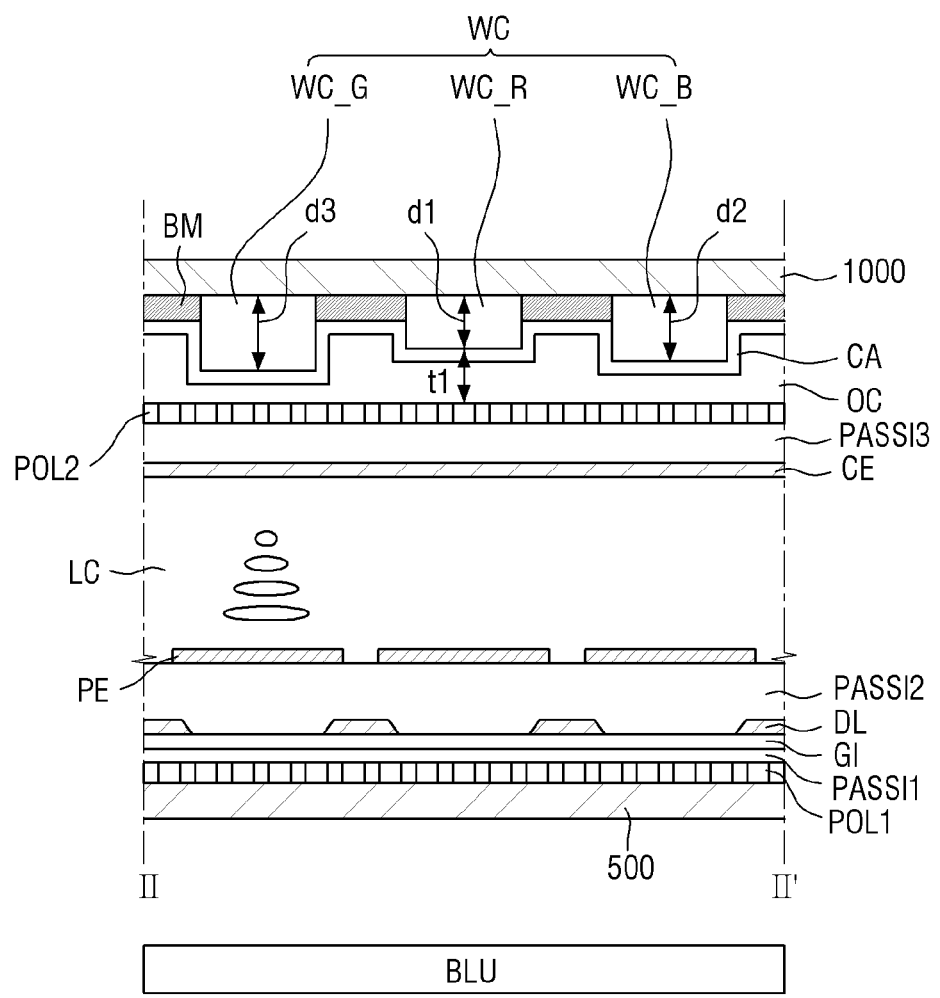
FIG. 9 is a cross-sectional view of a display device according to another exemplary embodiment of the present disclosure.

FIG. 9 is a cross-sectional view of a display device according to another exemplary embodiment of the present disclosure.

Referring to FIG. 9, in the display device according to this exemplary embodiment of the present disclosure, the plurality of wavelength conversion layers WC may have different heights.

The heights of the plurality of wavelength conversion layers WC may be different from one another. For example, as shown in FIG. 9, the height d3 of the green wavelength conversion layers WC_G, the height d1 of the red wavelength conversion layers WC_R, and the height d2 of the blue wavelength conversion layers WC_B may be different from one another. Specifically, the height d3 of the green wavelength conversion layers WC_G may be the largest, while the height d1 of the red wavelength conversion layers WC_R may be the smallest.

In an exemplary embodiment, the height d1 of the lowest wavelength conversion layers WC_R may range from 5 μm to 7 μm.

Although FIG. 9 illustrates the height of the red wavelength conversion layers WC_R is the lowest, this is merely illustrative. In other embodiments, the height of the wavelength conversion layer having a different color may be the lowest.

Such a height difference may provide the physical properties necessary for the wavelength conversion layers WC to emit light of a specific wavelength. That is, by adjusting the length by which light passes, it is possible to emit light of a specific wavelength.

In this exemplary embodiment, the thickness of the planarization layer OC may be defined as the distance t1 (see FIG. 9) from the lowest wavelength conversion layers WC, i.e., the upper surface of the red wavelength conversion layers WC_R to the upper surface of the planarization layer OC.

In this exemplary embodiment, the thickness of the planarization layer OC may range from 6 μm to 10 μm.

Figure 10:
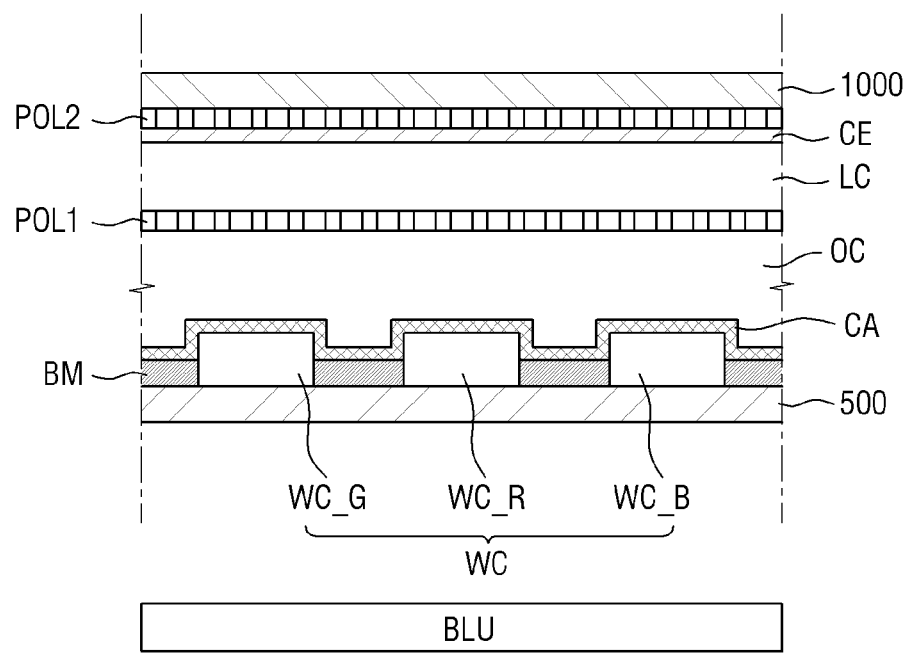
FIG. 10 is a cross-sectional view of a display device according to another exemplary embodiment of the present disclosure.

FIG. 10 is a cross-sectional view of a display device according to another exemplary embodiment of the present disclosure. Referring to FIG. 10, a display device according to this exemplary embodiment of the present disclosure is different from the display device according to the embodiment shown in FIG. 4 in that a wavelength conversion layers WC is disposed on a second substrate 500.

In an exemplary embodiment, the wavelength conversion layers WC may be disposed on the second substrate 500. The display device according to this exemplary embodiment of the present disclosure may be a display device employing a color filter on array (COA) substrate.

On the second substrate 500, various electrodes such as a gate electrode, a data wire and a pixel electrode may be disposed. The various electrodes may be disposed as shown in FIG. 4. However, it is to be understood that the arrangement of the electrodes is not limited thereto, and the various electrodes may be arranged in various ways. In FIG. 7, the specific arrangement of the electrodes is not shown in order not to unnecessarily limit the scope of the present disclosure.

A wavelength conversion layers WC may be disposed on the second substrate 500. The wavelength conversion layers WC may include a green wavelength conversion layers WC_G, a red wavelength conversion layers WC_R, and a blue wavelength conversion layers WC_B.

The plurality of wavelength conversion layers WC may be disposed apart from one another. That is, there may be a spacing between adjacent wavelength conversion layers WC.

A black matrix BM may be disposed in such a spacing. The black matrix BM may be substantially identical to that described above with respect to FIG. 4.

A capping layer CA and a planarization layer OC may be disposed on the wavelength conversion layers WC. The capping layer CA and the planarization layer OC may be substantially identical to those described above with respect to the display devices according to some embodiments of the present disclosure.

A second polarizing layer POL1 may be disposed on the planarization layer OC.

The liquid-crystal layer LC may be disposed on the planarization layer OC. The common electrode CE, the first polarizing layer POL2 and the first substrate 1000 may be disposed on the liquid-crystal layer LC. These elements are identical to those described above with respect to some embodiments of the present disclosure; and, therefore, the redundant description will be omitted.

Hereinafter, a method of fabricating a display device according to some exemplary embodiments of the present disclosure will be described. Some of elements described below may be identical to those of the LCD devices described above with respect to the some exemplary embodiments of the present disclosure; and, therefore, description thereof may be omitted to avoid redundancy.

FIGS. 11 to 14 are cross-sectional views for illustrating a method for fabricating a display device according to an exemplary embodiment of the present disclosure.

Referring to FIGS. 11 to 14, a method of fabricating a display device according to an exemplary embodiment of the present disclosure includes: preparing a first substrate 1000 having at least one wavelength conversion layer WC, forming a capping layer CA comprising a porous layer PL on the wavelength conversion layer WC, forming a planarization layer OC on the capping layer CA, and forming a first polarizing layer POL2 on the planarization layer OC.

Figure 11:
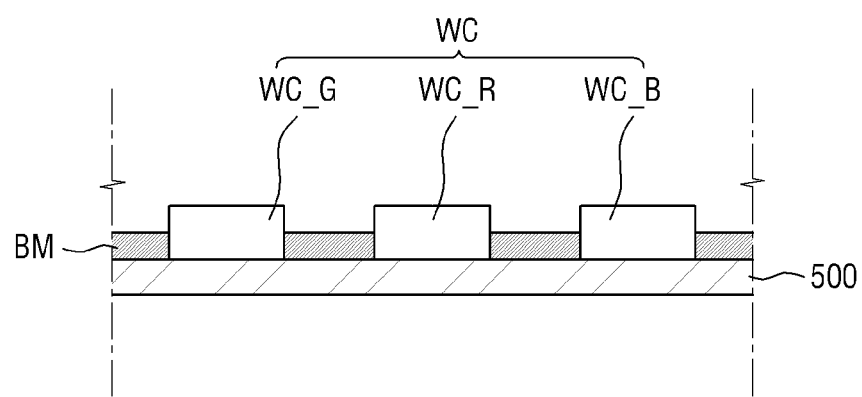
FIG. 11 is a cross-sectional view for illustrating a method of fabricating a display device according to an exemplary embodiment of the present disclosure.

Referring to FIG. 11, the method starts with preparing a first substrate 1000 having at least one wavelength conversion layer WC.

On the first substrate 1000, a black matrix BM may be disposed between a wavelength conversion layers WC and another wavelength conversion layers WC. The wavelength conversion layers WC and the black matrix BM may be substantially identical to those described above with respect to some embodiments of the present disclosure.

Figure 12:
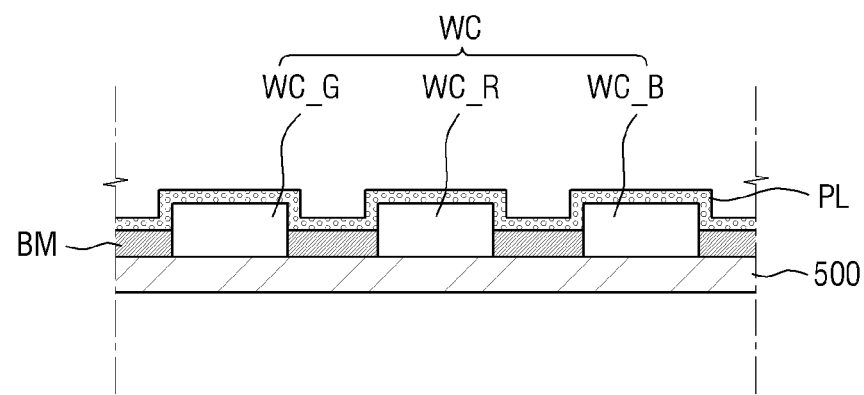
FIG. 12 is a cross-sectional view for illustrating a method of fabricating a display device according to an exemplary embodiment of the present disclosure.

Subsequently, referring to FIG. 12, the method includes forming a capping layer CA on the wavelength conversion layers WC. The forming the capping layer CA on the wavelength conversion layers WC includes forming a porous layer PL on the wavelength conversion layers WC, and forming at least one inorganic layer on the porous layer PL.

In an exemplary embodiment, the porous layer PL may be obtained by lowering the process temperature or increasing the deposition rate. For example, when the process temperature is set to 50° C. to 150° C. in forming the porous layer PL, micropores can be formed in the inorganic layer, such that a porous layer PL having a relatively large thermal expansion coefficient can be obtained.

Figure 13:
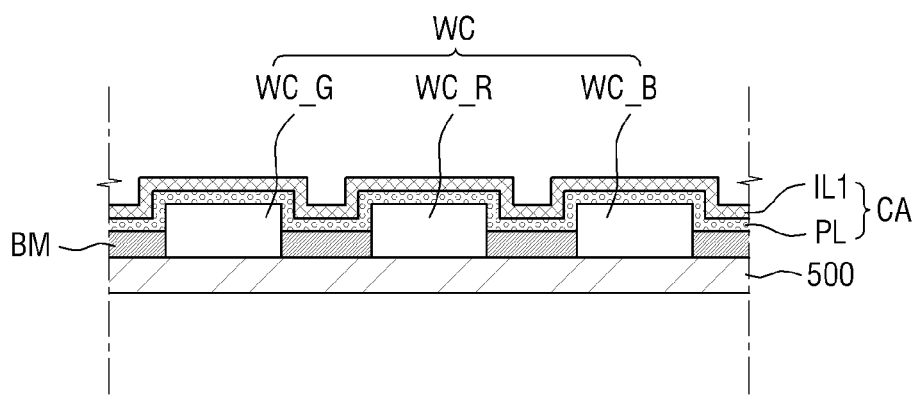
FIG. 13 is a cross-sectional view for illustrating a method of fabricating a display device according to an exemplary embodiment of the present disclosure.

Subsequently, the method may include forming at least one inorganic layer on the porous layer PL. Although FIG. 13 illustrates the first inorganic layer IL1 as being formed on the porous layer PL, the number of inorganic layers is not limited thereto. That is, a plurality of inorganic layers may be formed on the porous layer PL as illustrated in FIG. 6 or 7.

The process of forming at least one inorganic layer may be carried out at a temperature of 200° C. or higher. In this case, the inorganic layer has a higher density than the porous layer PL described above and has a lower thermal expansion coefficient than the porous layer PL.

Figure 14:
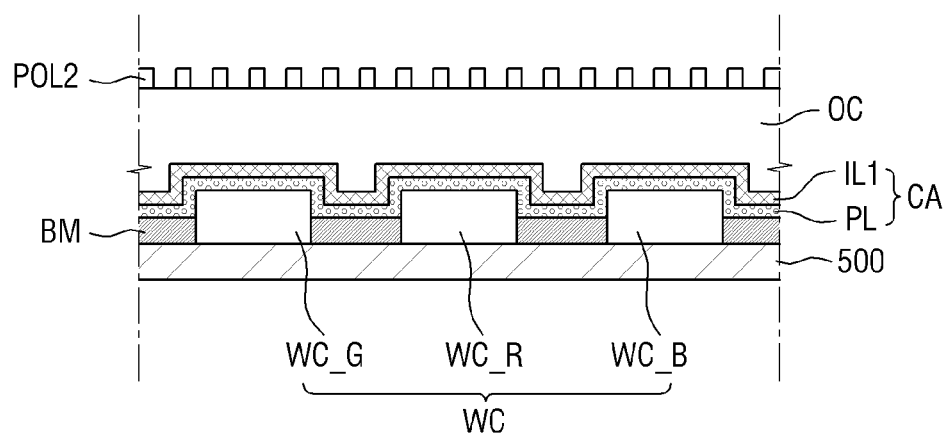
FIG. 14 is a cross-sectional view for illustrating a method of fabricating a display device according to an exemplary embodiment of the present disclosure.

Subsequently, referring to FIG. 14, the method may include forming a planarizing layer OC on the capping layer CA, and forming a first polarizing layer POL2 on the planarization layer OC.

The planarization layer OC may be disposed on the capping layer CA. The planarization layer OC may be made of an organic and/or inorganic insulating material. The planarization layer OC may be formed over the entire area of the first substrate 1000 and provide a flat surface over the features formed on the first substrate 1000. Although FIG. 14 illustrates the planarization layer OC made up of a single layer, this is merely illustrative. In another embodiment, the planarization layer OC may include two or more layers.

In an exemplary embodiment, the thickness of the planarization layer OC may range from 6 μm to 10 μm.

In an exemplary embodiment, the thermal expansion coefficient of the planarization layer OC may be 53.3 ppm/K or less.

In an exemplary embodiment, the planarization layer OC may comprise polyimide PI.

Subsequently, the method may include forming the first polarizing layer POL2 on the planarization layer OC.

The first polarizing layer POL2 may be substantially identical to that described above with respect to the display devices according to some embodiments of the present disclosure.

In an exemplary embodiment, the first polarizing layer POL2 may include a wire-grid-polarizer (WGP). In an exemplary embodiment in which the first polarizing layer POL2 includes the wire grid polarizer, the first polarizing layer POL2 may be formed by imprinting or block copolymer deposition. However, this is merely illustrative and the first polarization layer POL2 may be formed in different ways.

In an exemplary embodiment, the method may include attaching a second substrate 500 facing the first substrate 1000 to the first substrate 1000. In this manner, the display devices according to some exemplary embodiments of the present disclosure can be fabricated by the method for fabricating a display device according to the exemplary embodiment of the present disclosure.

While the present inventice concept has been particularly illustrated and described with reference to exemplary embodiments thereof, it will be understood by those of ordinary skill in the art that various changes in form and detail may be made therein without departing from the spirit and scope of the present inventice concept as defined by the following claims. The exemplary embodiments should be considered in a descriptive sense only and not for purposes of limitation.

What is claimed is:

1. A display device comprising:
a first substrate;
at least one wavelength conversion layer disposed on the first substrate;
a capping layer disposed on the wavelength conversion layer and comprising a porous layer and a first inorganic layer;
a planarization layer disposed on the capping layer;
a black matrix disposed between the capping layer and the first substrate; and
a first polarizing layer disposed on the planarization layer,
wherein the porous layer is disposed between the wavelength conversion layer and the first inorganic layer,
wherein the porous layer contacts the wavelength conversion layer and the black matrix, and
wherein the porous layer has a thermal expansion coefficient larger than the thermal expansion coefficient of the first inorganic layer and smaller than the thermal expansion coefficient of the planarization layer.

2. The display device of claim 1, wherein the wavelength conversion layer comprises quantum dots.

3. The display device of claim 1, wherein a thickness of the wavelength conversion layer ranges from 5 μm to 7 μm.

4. The display device of claim 1, wherein the porous layer and the first inorganic layer are made of a same material.

5. The display device of claim 4, wherein the porous layer and the first inorganic layer comprises at least one selected from a group consisting of silicon nitride, silicon oxide and silicon oxynitride.

6. The display device of claim 4, wherein a density of the porous layer is smaller than that of the first inorganic layer.

7. The display device of claim 4, wherein the thermal expansion coefficient of the porous layer ranges from 2.5 ppm/K to 5.0 ppm/K.

8. The display device of claim 1, wherein the capping layer further comprises a second inorganic layer disposed on the first inorganic layer.

9. The display device of claim 8, wherein the first inorganic layer and the second inorganic layer are made of different materials.

10. The display device of claim 9, wherein the capping layer comprises a plurality of first inorganic layers and a plurality of second inorganic layers, and wherein the first inorganic layers and the second inorganic layers are alternately disposed.

11. The display device of claim 1, wherein the capping layer is configured to transmit blue light and reflect green light and red light.

12. The display device of claim 1, wherein the at least one wavelength conversion layer comprises a plurality of wavelength conversion layers, and wherein the wavelength conversion layers have different heights.

13. The display device of claim 1, further comprising: a light-transmitting layer disposed adjacent to the wavelength conversion layer.

14. A method of fabricating a display device, the method comprising:
preparing a first substrate having at least one wavelength conversion layer and a black matrix;
forming a capping layer including a porous layer and a first inorganic layer;
forming a planarization layer on the capping layer; and
forming a first polarizing layer on the planarization layer,
wherein the forming the capping layer comprising a porous layer and a first inorganic layer comprises: forming the porous layer on the wavelength conversion layer and the black matrix, and forming a first inorganic layer on the porous layer, the porous layer contacting the wavelength conversion layer and the black matrix, and
wherein the porous layer has a thermal expansion coefficient larger than the thermal expansion coefficient of the first inorganic layer and smaller than the thermal expansion coefficient of the planarization layer.

15. The method of claim 14, further comprising: forming a second inorganic layer on the first inorganic layer.

16. The display device of claim 15, wherein the first inorganic layer and the second inorganic layer are made of different materials.

17. The method of claim 14, wherein a process temperature for forming the porous layer ranges from 50° C. to 150° C., and a process temperature for forming the first inorganic layer is 200° C. or higher.

* * * * *